United States Patent
Sun et al.

(10) Patent No.: US 11,935,985 B2
(45) Date of Patent: Mar. 19, 2024

(54) MICRO LIGHT-EMITTING DIODE DISPLAY PANEL

(71) Applicant: PlayNitride Display Co., Ltd., MiaoLi County (TW)

(72) Inventors: Sheng-Yuan Sun, MiaoLi County (TW); Loganathan Murugan, MiaoLi County (TW); Po-Wei Chiu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 347 days.

(21) Appl. No.: 17/408,498

(22) Filed: Aug. 23, 2021

(65) Prior Publication Data

US 2022/0246794 A1 Aug. 4, 2022

(30) Foreign Application Priority Data

Feb. 4, 2021 (TW) .................. 110104124

(51) Int. Cl.
  *H01L 33/10* (2010.01)
  *H01L 25/075* (2006.01)
  *H01L 27/15* (2006.01)

(52) U.S. Cl.
  CPC .......... *H01L 33/10* (2013.01); *H01L 25/0753* (2013.01); *H01L 27/156* (2013.01)

(58) Field of Classification Search
  None
  See application file for complete search history.

(56) References Cited

U.S. PATENT DOCUMENTS

| | | | | |
|---|---|---|---|---|
| 2017/0309789 | A1* | 10/2017 | Kurimoto | ............. H01L 27/156 |
| 2018/0277591 | A1 | 9/2018 | Wu et al. | |
| 2019/0198483 | A1 | 6/2019 | Wang et al. | |
| 2019/0325803 | A1* | 10/2019 | Chen | ........................ G09G 3/32 |

(Continued)

FOREIGN PATENT DOCUMENTS

| | | | | |
|---|---|---|---|---|
| CN | 106684108 | | 5/2017 | |
| CN | 109116631 | A * | 1/2019 | ....... G02F 1/133603 |

(Continued)

OTHER PUBLICATIONS

English language machine-translation of CN-109116631-A.*

(Continued)

*Primary Examiner* — Robert K Carpenter
(74) *Attorney, Agent, or Firm* — JCIPRNET

(57) ABSTRACT

A micro light-emitting diode (LED) display panel including a substrate, a first micro LED, a first light-shielding wall, a second micro LED, and a second light-shielding wall is provided. The substrate includes a plurality of pixel regions arranged in an array. The first micro LED is disposed on one of the pixel regions of the substrate. The first light-shielding wall is disposed on the substrate and located beside the first micro LED. The second micro LED is disposed on the one of the pixel regions of the substrate and located beside the first micro LED. The second light-shielding wall is disposed on the substrate and located beside the second micro LED. A light wavelength of the first micro LED is different from a light wavelength of the second micro LED. A height of the first light-shielding wall is smaller than a height of the second light-shielding wall.

14 Claims, 13 Drawing Sheets

(56) References Cited

U.S. PATENT DOCUMENTS

2020/0051967 A1 2/2020 Kim et al.
2020/0365774 A1* 11/2020 Zhang .................... H01L 33/62
2021/0005588 A1 1/2021 Chung et al.

FOREIGN PATENT DOCUMENTS

| CN | 111512460 | 8/2020 |
| WO | 2020063701 | 4/2020 |
| WO | 2021002610 | 1/2021 |

OTHER PUBLICATIONS

"Office Action of Taiwan Counterpart Application", dated Sep. 17, 2021, p. 1-p. 6.
"Office Action of China Counterpart Application", dated Nov. 16, 2022, p. 1-p. 7.

\* cited by examiner

MICRO LIGHT-EMITTING DIODE DISPLAY PANEL

CROSS-REFERENCE TO RELATED APPLICATION

This application claims the priority benefit of Taiwan application serial no. 110104124, filed on Feb. 4, 2021. The entirety of the above-mentioned patent application is hereby incorporated by reference herein and made a part of this specification.

BACKGROUND

Technical Field

The invention relates to a display panel, and particularly relates to a micro light-emitting diode (LED) display panel.

Description of Related Art

Generally, an image on a screen is composed of pixels. One pixel has three sub-pixels of red, green, and blue, and these three sub-pixels form displayed colors through red light, blue light, and green light. However, when light-emitting diodes (LEDs) are used as the sub-pixels to emit light, since a light-emitting pattern of a red LED is largely different to light-emitting patterns of a blue LED and a green LED, and the red light is more concentrated in a forward light-emitting direction, it is difficult to cover a large angle range. Therefore, if a user views the screen at a large angle position (a relatively oblique position) relative to the forward light-emitting direction, a viewed image may have a color shift phenomenon due to the lack of red light of the image.

SUMMARY

The invention is directed to a micro light-emitting diode (LED) display panel, which has lower probability of a color shift phenomenon.

The invention provides a micro LED display panel including a substrate, a first micro LED, a first light-shielding wall, a second micro LED, and a second light-shielding wall. The substrate includes a plurality of pixel regions arranged in an array. The first micro LED is disposed on one of the pixel regions of the substrate. The first light-shielding wall is disposed on the substrate and located beside the first micro LED. The second micro LED is disposed on the pixel region of the substrate and located beside the first micro LED. The second light-shielding wall is disposed on the substrate and located beside the second micro LED, wherein a light wavelength of the first micro LED is different from a light wavelength of the second micro LED, and a height of the first light-shielding wall is smaller than a height of the second light-shielding wall.

In an embodiment of the invention, the height of the first light-shielding wall is smaller than a height of the first micro LED, and the height of the second light-shielding wall is greater than a height of the second micro LED.

In an embodiment of the invention, a distance between the first light-shielding wall and the first micro LED is greater than a distance between the second light-shielding wall and the second micro LED.

In an embodiment of the invention, a portion of the first light-shielding wall located between the first micro LED and the second micro LED is connected to a portion of the second light-shielding wall located between the first micro LED and the second micro LED.

In an embodiment of the invention, the micro LED display panel further includes a light-absorbing material disposed on the substrate and filled between the first light-shielding wall and the first micro LED, and between the second light-shielding wall and the second micro LED, wherein a height of the light-absorbing material is smaller than a height of the first micro LED.

In an embodiment of the invention, a material of the light-absorbing material is the same as a material of the first light-shielding wall and the second light-shielding wall.

In an embodiment of the invention, a material of the light-absorbing material is different from a material of the first light-shielding wall and the second light-shielding wall.

In an embodiment of the invention, the micro LED display panel further includes a first reflector, a first transparent insulating layer, a second reflector, and a second transparent insulating layer. The first reflector is located within the first light-shielding wall and arranged around the first micro LED. The first reflector has a first inclined surface inclined toward the first micro LED. The first transparent insulating layer is filled between the first micro LED and the first inclined surface. The second reflector is located within the second light-shielding wall and arranged around the second micro LED. The second reflector has a second inclined surface inclined toward the second micro LED. The second transparent insulating layer is filled between the second micro LED and the second inclined surface, wherein a refractive index of the first transparent insulating layer is smaller than a refractive index of the first micro LED, and a refractive index of the second transparent insulating layer is smaller than a refractive index of the second micro LED.

In an embodiment of the invention, the first transparent insulating layer directly contacts a side wall of the first micro LED, the first reflector directly contacts the first transparent insulating layer, the second transparent insulating layer directly contacts a side wall of the second micro LED, and the second reflector directly contacts the second transparent insulating layer.

In an embodiment of the invention, an inclination angle of the first inclined surface is different from an inclination angle of the second inclined surface.

In an embodiment of the invention, the micro LED display panel further includes a third micro LED and a third light-shielding wall. The third micro LED is disposed on the pixel region of the substrate and located beside the first micro LED or the second micro LED. The third light-shielding wall is disposed on the pixel region of the substrate and located beside the third micro LED, wherein the light wavelength of the first micro LED is greater than a light wavelength of the third micro LED, and the height of the first light-shielding wall is smaller than a height of the third light-shielding wall.

In an embodiment of the invention, the height of the third light-shielding wall is greater than a height of the third micro LED.

In an embodiment of the invention, a distance between the first light-shielding wall and the first micro LED is greater than a distance between the third light-shielding wall and the third micro LED.

In an embodiment of the invention, the first light-shielding wall and the second light-shielding wall, the second light-shielding wall and the third light-shielding wall or/and the first light-shielding wall and the third light-shielding wall between any adjacent two of the first micro LED, the second micro LED, and the third micro LED are connected.

In an embodiment of the invention, the micro LED display panel further includes a light-absorbing material disposed on the substrate and filled between the first light-shielding wall and the first micro LED, between the second light-shielding wall and the second micro LED, and between the third light-shielding wall and the third micro LED, wherein a height of the light-absorbing material is smaller than the height of the first light-shielding wall.

In an embodiment of the invention, the micro LED display panel further includes a first reflector, a first transparent insulating layer, a second reflector, a second transparent insulating layer, a third reflector and a third transparent insulating layer. The first reflector is located within the first light-shielding wall and arranged around the first micro LED. The first reflector has a first inclined surface inclined toward the first micro LED. The first transparent insulating layer is filled between the first micro LED and the first inclined surface. The second reflector is located within the second light-shielding wall and arranged around the second micro LED. The second reflector has a second inclined surface inclined toward the second micro LED. The second transparent insulating layer is filled between the second micro LED and the second inclined surface. The third reflector is located within the third light-shielding wall and arranged around the third micro LED. The third reflector has a third inclined surface inclined toward the third micro LED. The third transparent insulating layer is filled between the third micro LED and the third inclined surface, wherein a refractive index of the first transparent insulating layer is smaller than a refractive index of the first micro LED, a refractive index of the second transparent insulating layer is smaller than a refractive index of the second micro LED, and a refractive index of the third transparent insulating layer is smaller than a refractive index of the third micro LED.

In an embodiment of the invention, an inclination angle of the first inclined surface is different from an inclination angle of the second inclined surface, and the inclination angle of the first inclined surface is different from an inclination angle of the third inclined surface.

Based on the above description, the first light-shielding wall of the micro LED display panel of the invention is disposed on the substrate and arranged outside the first micro LED, and the second light-shielding wall is disposed on the substrate and arranged outside the second micro LED. The light wavelength of the first micro LED is different from the light wavelength of the second micro LED, and the height of the first light-shielding wall is smaller than the height of the second light-shielding wall. Through the above design, the micro LED display panel of the invention may adjust an irradiation angle of the light emitted by the first micro LED and the second micro LED through the heights of the first light-shielding wall and the second light-shielding wall, so that the light pattern and the irradiation angle of light with a large wavelength are close to the light pattern and the irradiation angle of light with a small wavelength, and the light patterns of light of different colors are closer to reduce probability of a color shift phenomenon in a large-angle region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
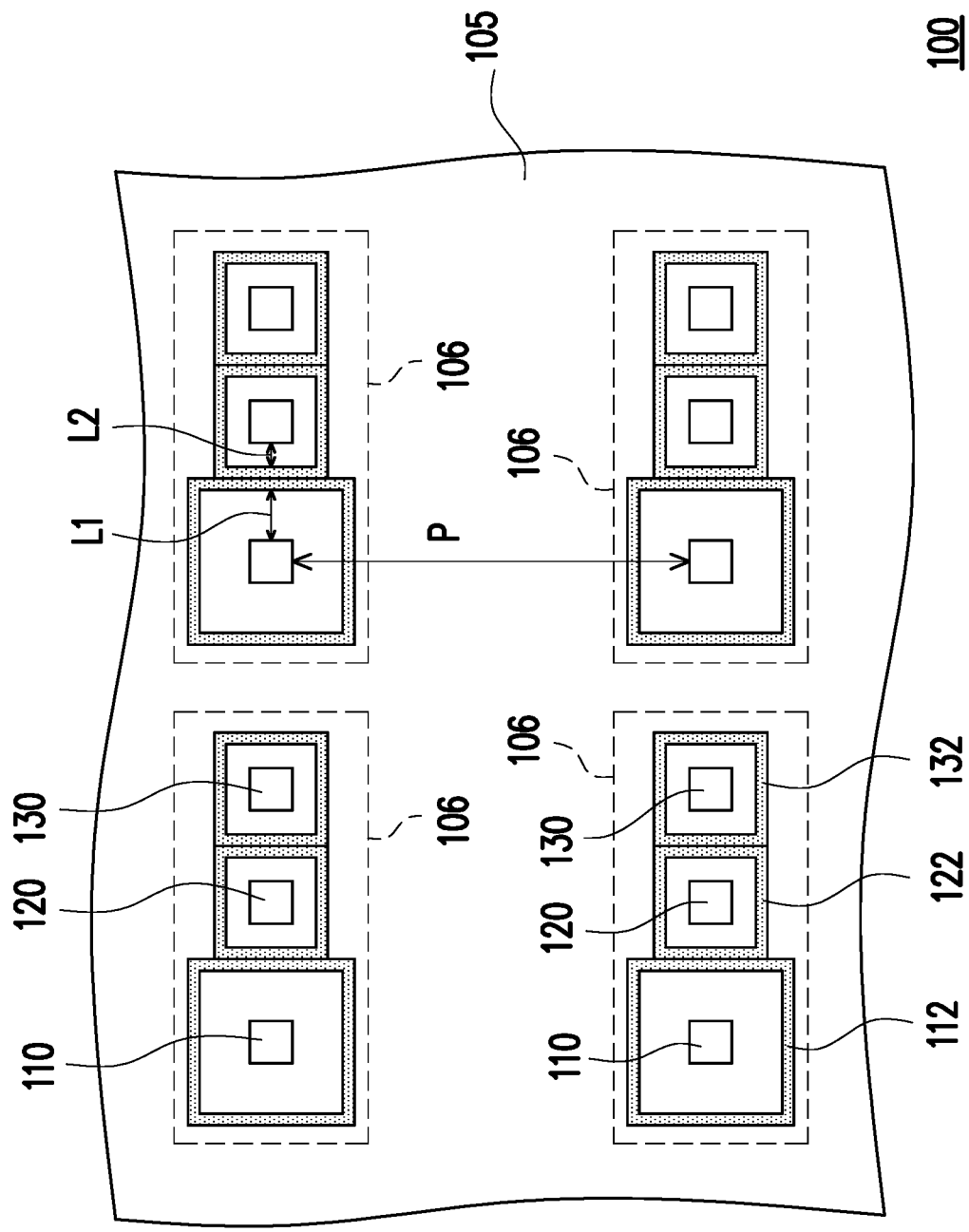
FIG. 1A is a schematic partial top view of a micro LED display panel according to an embodiment of the invention.
Figure 1B:
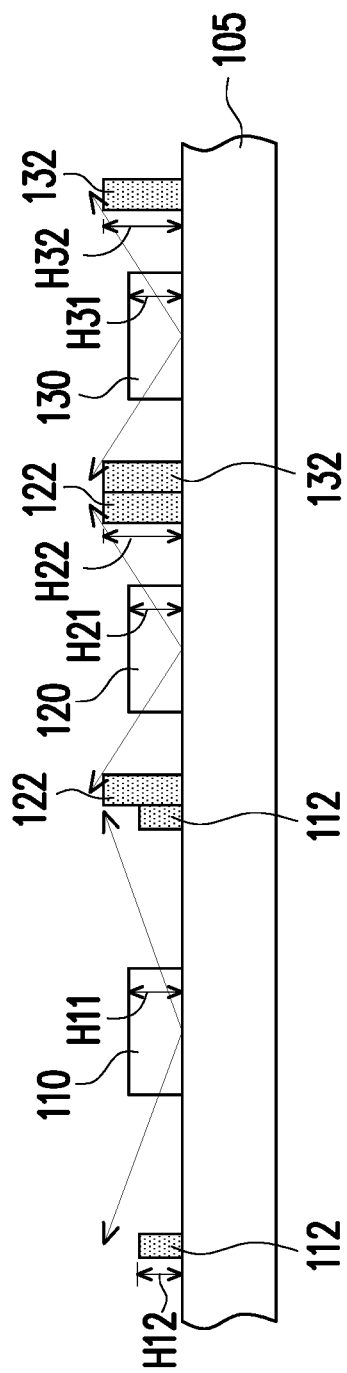
FIG. 1B is a schematic cross-sectional view of one pixel region of the micro LED display panel of FIG. 1A.

FIG. 1A is a schematic partial top view of a micro LED display panel according to an embodiment of the invention. FIG. 1B is a schematic cross-sectional view of one pixel region of the micro LED display panel of FIG. 1A. Referring to FIG. 1A and FIG. 1B, in the embodiment, a micro LED display panel 100 includes a substrate 105, a first micro LED 110, a first light-shielding wall 112, a second micro LED 120, a second light-shielding wall 122, a third micro LED 130 and a third light-shielding wall 132.

The substrate 105 includes a plurality of pixel regions 106 arranged in an array. Each of the pixel regions 106 may include the first micro LED 110, the second micro LED 120 and the third micro LED 130. In two adjacent pixel regions 106, there is a pitch P between the two first micro LEDs 110.

In one of the pixel regions 106 of the embodiment, the first micro LED 110 is disposed on the pixel region 106 of the substrate 105. The first light-shielding wall 112 is disposed on the substrate 105 and located beside the first micro LED 110.

The second micro LED 120 is disposed on the pixel region 106 of the substrate 105 and located beside the first micro LED 110. The second light-shielding wall 122 is disposed on the substrate 105 and located beside the second micro LED 120.

The third micro LED 130 is disposed on the pixel region 106 of the substrate 105 and located beside the first micro LED 110 or the second micro LED 120. In the embodiment, the first micro LED 110, the second micro LED 120 and the third micro LED 130 are sequentially arranged, but the arrangement is not limited thereto. The third light-shielding wall 132 is disposed on the pixel region 106 of the substrate 105 and disposed beside the third micro LED 130.

The first light-shielding wall 112, the second light-shielding wall 122, and the third light-shielding wall 132 are also referred to as black matrices (BM), which are black or dark, and may be used to shield light, absorb ambient light, and adjust a light pattern and an irradiation angle. A material of the first light-shielding wall 112, the second light-shielding wall 122, and the third light-shielding wall 132 is, for example, photoresist, but the invention is not limited thereto.

In the embodiment, a light wavelength of the first micro LED 110 is greater than a light wavelength of the second micro LED 120, and the light wavelength of the second micro LED 120 is greater than a light wavelength of the third micro LED 130. For example, the first micro LED 110 is, for example, a red LED, the second micro LED 120 is, for example, a green LED, and the third micro LED 130 is, for example, a blue LED. Certainly, the types of the first micro LED 110, the second micro LED 120, and the third micro LED 130 are not limited thereto.

Figure 2:
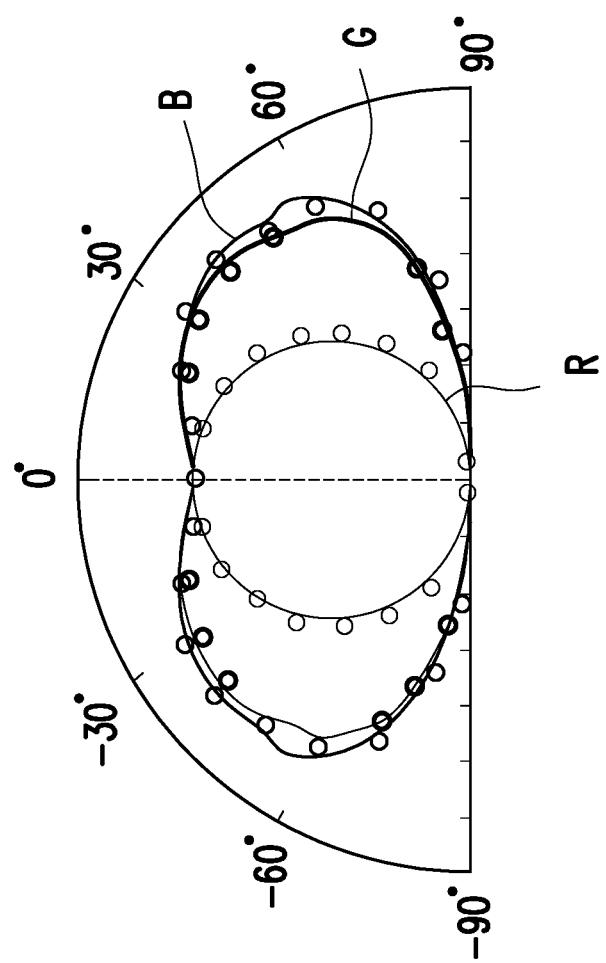
FIG. 2 is a light pattern diagram of a general red light micro LED, a blue light micro LED and a green light micro LED.

FIG. 2 is a light pattern diagram of a general red light micro LED, a blue light micro LED and a green light micro LED. Referring to FIG. 2, compared with a blue light pattern B and a green light pattern G, since a red light pattern R is smaller, and the red light pattern R is more concentrated on a forward light-emitting direction, it is difficult to cover a large angle range (an upper right and upper left oblique angle ranges in the light pattern diagram), so that an angle difference between the range covered by the red light and the range covered by the blue and green light may reach about ±20 degrees. This will result in a fact that the micro LED display panel 100 only has blue and green light in a large-angle region with respect to the forward light-emitting direction (right above), so that such region has a large color shift phenomenon.

In order to reduce the angle difference between the ranges covered by the red, blue and green light, referring back to FIG. 1B, in the embodiment, a height H12 of the first light-shielding wall 112 is smaller than a height H22 of the second light-shielding wall 122, and the height H12 of the first light-shielding wall 112 is smaller than a height H32 of the third light-shielding wall 132.

To be specific, the height H12 of the first light-shielding wall 112 is substantially between 1 μm and 10 μm, and the height H22 of the second light-shielding wall 122 and the height H32 of the third light-shielding wall 132 are substantially greater than 10 μm. Certainly, the height H12 of the first light-shielding wall 112, the height H22 of the second light-shielding wall 122, and the height H32 of the third light-shielding wall 132 are not limited thereto.

Through the design of the micro LED display panel 100 of the embodiment that the height H22 of the second light-shielding wall 122 and the height H32 of the third light-shielding wall 132 are greater than the height H12 of the first light-shielding wall 112, in the light emitted by the second micro LED 120 and the third micro LED 130, light of a large angle may be shielded by the second light-shielding wall 122 and the third light-shielding wall 132, so as to limit the angle ranges of the green and blue light.

In addition, since the height H12 of the first light-shielding wall 112 is the smallest, the angle at which the red light is limited is the smallest, so that the angle difference between the ranges covered by the red light, blue light, and green light may be reduced. In this way, an overall light pattern of the light emitted by the micro LED display panel 100 of the embodiment is concentrated, and the probability of the color shift phenomenon in the large-angle region is lower.

It should be noted that in the embodiment, a relative position between the second light-shielding wall 122 and the first micro LED 110 may be adjusted, so that a portion of the second light-shielding wall 122 located between the first micro LED 110 and the second micro LED 120 does not affect the angle range covered by the red light.

In addition, as shown in FIG. 1A, in the embodiment, a distance L1 between the first light-shielding wall 112 and the first micro LED 110 is greater than a distance L2 between the second light-shielding wall 122 and the second micro LED 120, so as to minimize the angle at which the red light is limited. Certainly, the relationship of the distances L1 and L2 is not limited thereto.

In addition, as shown in FIG. 1B, in the embodiment, the height H12 of the first light-shielding wall 112 is smaller than a height H11 of the first micro LED 110, the height H22 of the second light-shielding wall 122 is greater than a height H21 of the second micro LED 120, and the height H32 of the third light-shielding wall 132 is greater than a height H31 of the third micro LED 130, but the invention is not limited thereto.

In the embodiment, since the light patterns of the green light and the blue light are close, the height H22 of the second light-shielding wall 122 may be the same as the height H32 of the third light-shielding wall 132, but in other embodiments, the height H22 of the second light-shielding wall 122 may also be different from the height H32 of the third light-shielding wall 132.

In addition, although the micro LED display panel 100 in the embodiment has three LEDs, in other embodiments, the micro LED display panel may also have only two LEDs (the first micro LED 110 and the second micro LED 120) and two light-shielding walls (the first light-shielding wall 112 and the second light-shielding wall 122), or more than three LEDs and more than three light-shielding walls, which is not limited by the diagram.

Moreover, in the embodiment, the first light-shielding wall 112 and the second light-shielding wall 122, the second light-shielding wall 122 and the third light-shielding wall 132 or/and the first light-shielding wall 112 and the third light-shielding wall 132 between any adjacent two of the first micro LED 110, the second micro LED 120, and the third micro LED 130 are connected.

To be specific, a portion of the first light-shielding wall 112 located between the first micro LED 110 and the second micro LED 120 is connected to a portion of the second light-shielding wall 122 located between the first micro LED 110 and the second micro LED 120. A portion of the second light-shielding wall 122 located between the second micro LED 120 and the third micro LED 130 is connected to a portion of the third light-shielding wall 132 located between the second micro LED 120 and the third micro LED 130. Such design may facilitate producing the light-shielding walls and help increasing a structural strength, and increase the contrast.

Figure 3A:
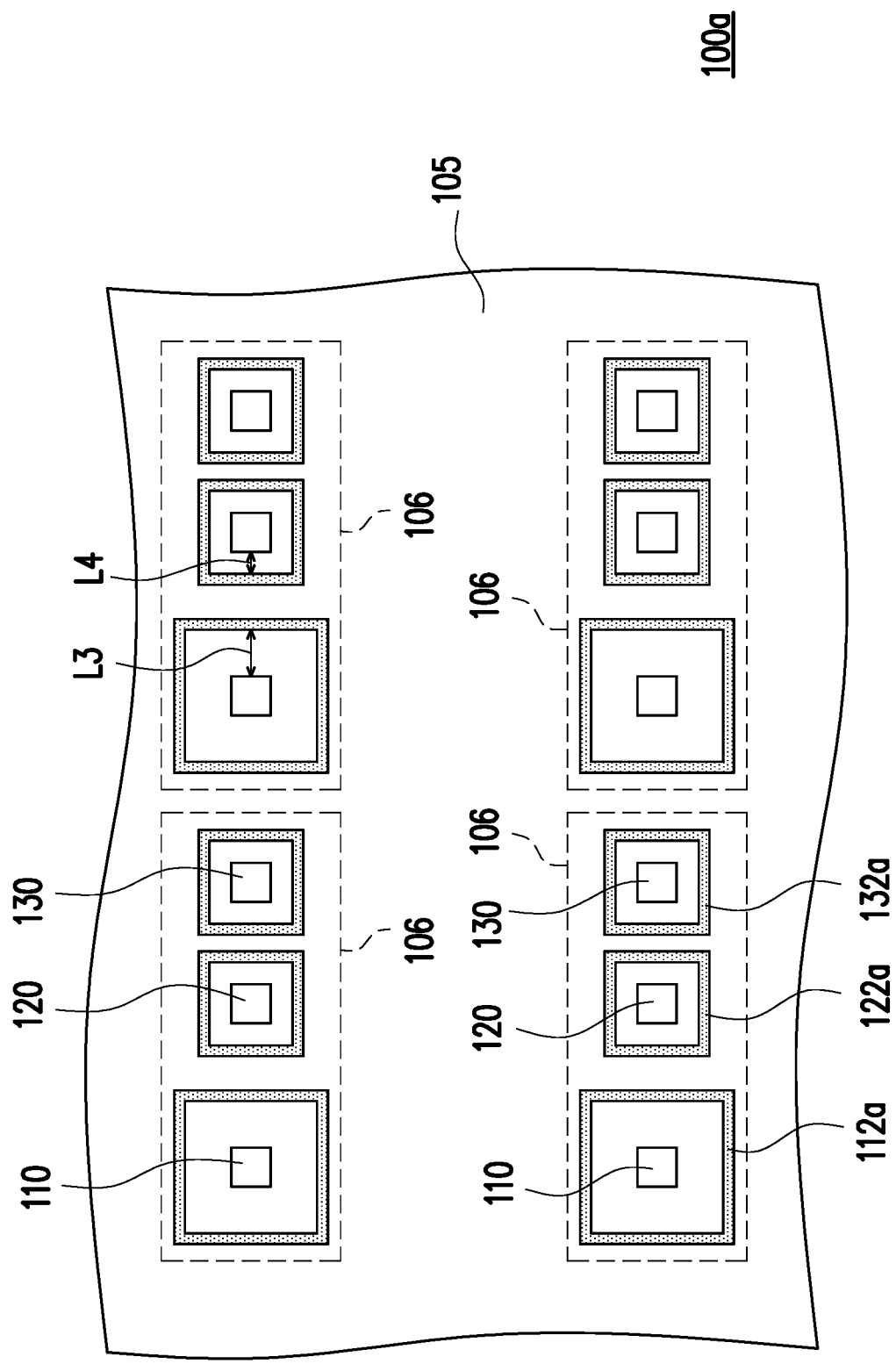
FIG. 3A is a schematic partial top view of a micro LED display panel according to another embodiment of the invention.
Figure 3B:
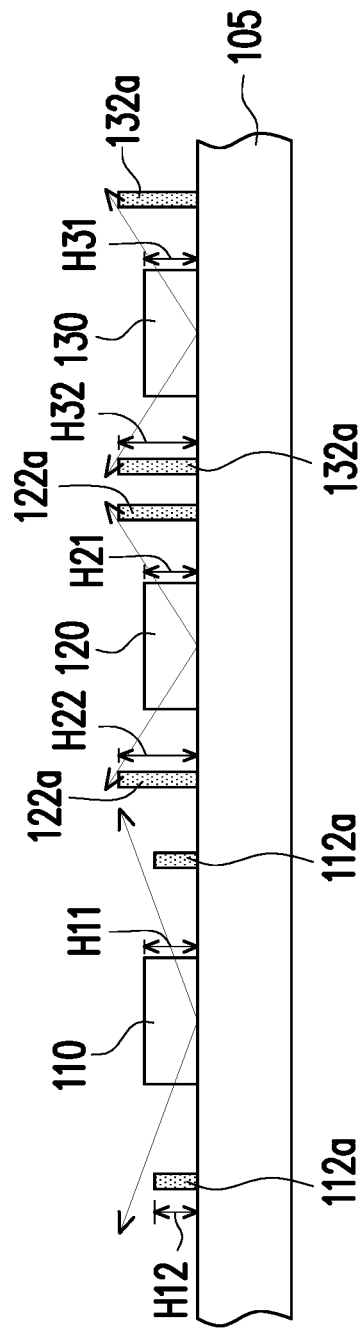
FIG. 3B is a schematic cross-sectional view of one pixel region of the micro LED display panel of FIG. 3A.

FIG. 3A is a schematic partial top view of a micro LED display panel according to another embodiment of the invention. FIG. 3B is a schematic cross-sectional view of one pixel region of the micro LED display panel of FIG. 3A. Referring to FIG. 3A and FIG. 3B, a main difference between a micro LED display panel 100a of FIG. 3A and the micro LED display panel 100 of FIG. 1A is that in the embodiment, a first light-shielding wall 112a, a second light-shielding wall 122a, and a third light-shielding wall 132a are separated from each other. In the embodiment, thicknesses of the first light-shielding wall 112a, the second light-shielding wall 122a, and the third light-shielding wall 132a may be reduced to reduce an area occupied by the light-shielding walls, so as to increase an overall brightness.

Similarly, in the embodiment, a distance L3 between the first light-shielding wall 112a and the first micro LED 110 is greater than a distance L4 between the second light-shielding wall 122a and the second micro LED 120, so as to minimize the angle at which the red light is limited. Certainly, the relationship of the distances L3 and L4 is not limited thereto.

Figure 4A:
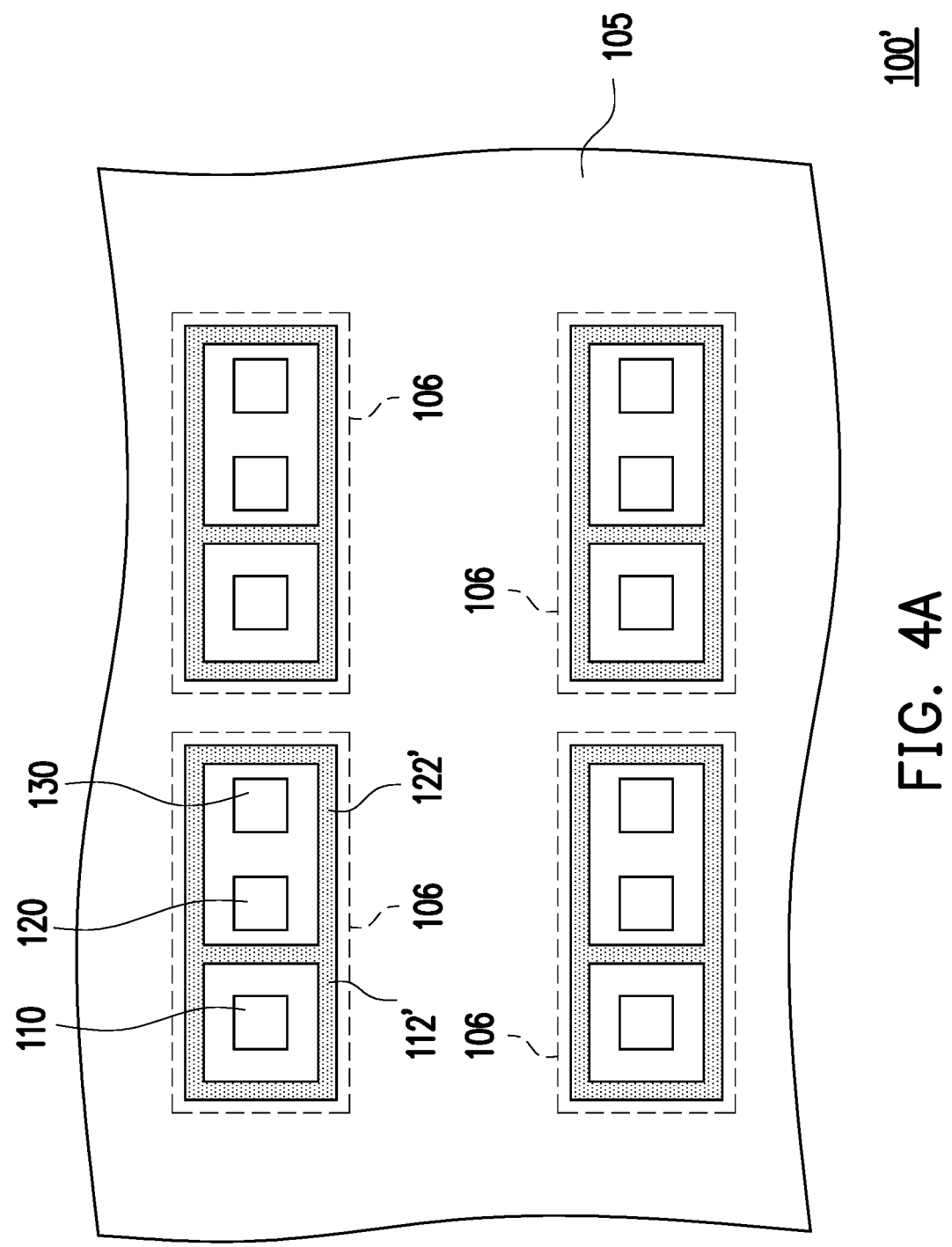
FIG. 4A is a schematic partial top view of a micro LED display panel according to another embodiment of the invention.
Figure 4B:
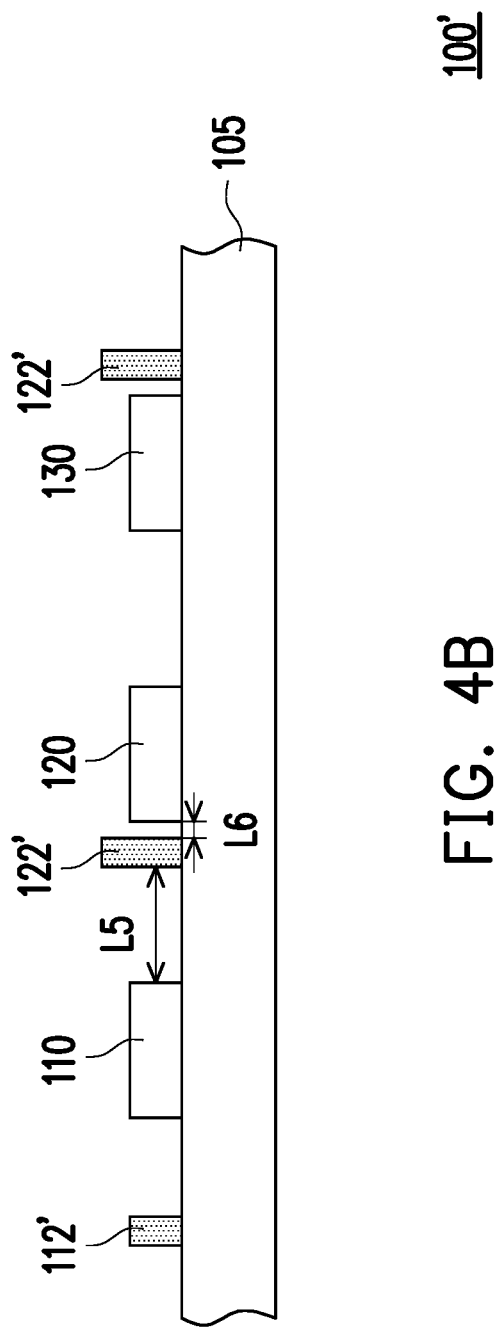
FIG. 4B is a schematic cross-sectional view of one pixel region of the micro LED display panel of FIG. 4A.

FIG. 4A is a schematic partial top view of a micro LED display panel according to another embodiment of the invention. FIG. 4B is a schematic cross-sectional view of one pixel region of the micro LED display panel of FIG. 4A. Referring to FIG. 4A and FIG. 4B, in the embodiment, a first light-shielding wall 112' is located on three sides of the first micro LED 110, the second micro LED 120 and the third micro LED 130 share a same second light-shielding wall 122', and the second light-shielding wall 122' surrounds the second micro LED 120 and the third micro LED 130. In the embodiment, since the area of the light-shielding walls is less, such design may be applied to a transparent display panel.

According to FIG. 4B, in the embodiment, a distance L5 between the first light-shielding wall 112' and the first micro LED 110 is greater than a distance L6 between the second light-shielding wall 122' and the second micro LED 120, so as to minimize the angle at which the red light is limited. Certainly, the relationship of the distances L5 and L6 is not limited thereto.

Figure 5:
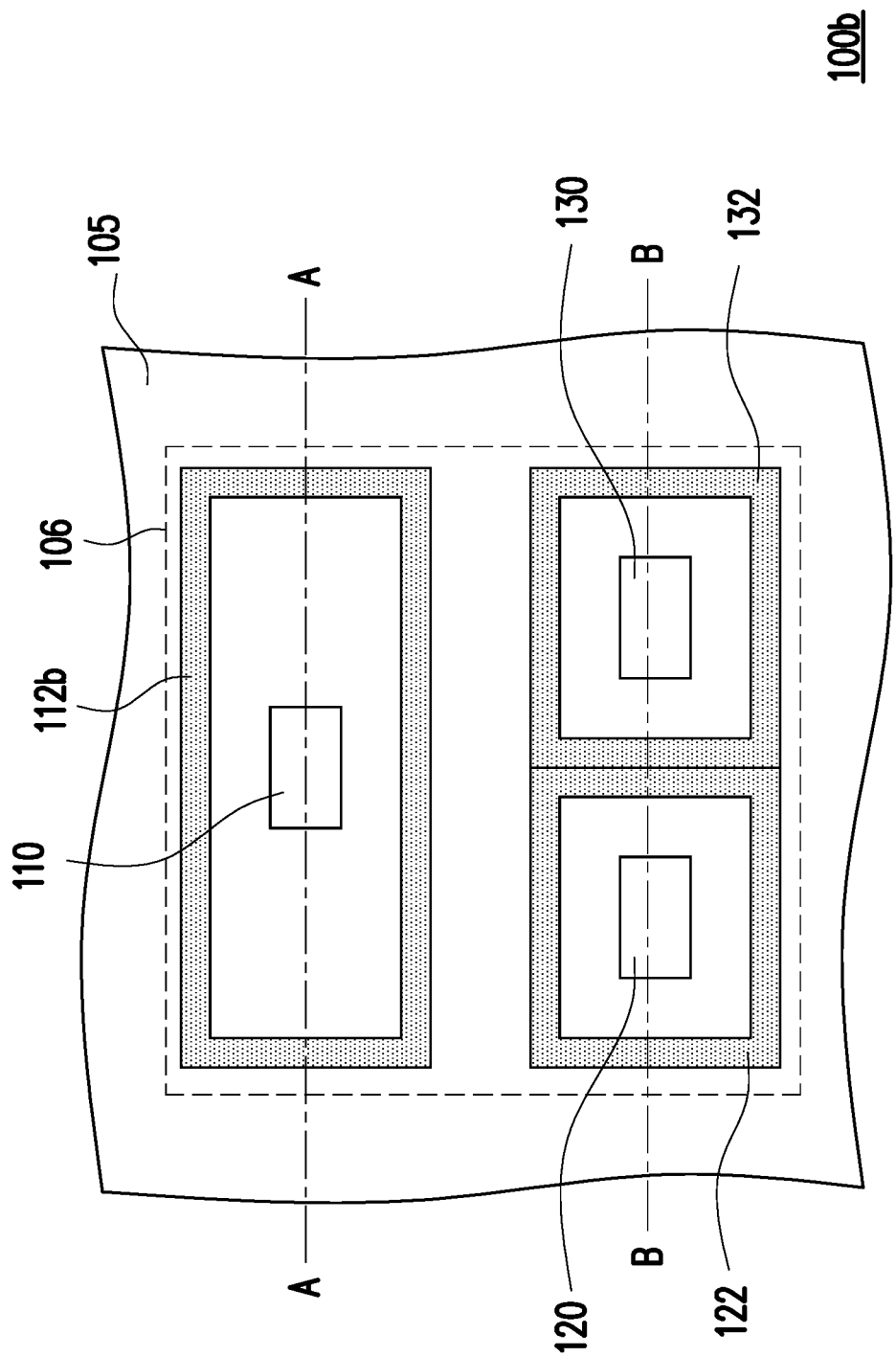
FIG. 5 is a schematic top view of a micro LED display panel according to another embodiment of the invention.
Figure 6A:
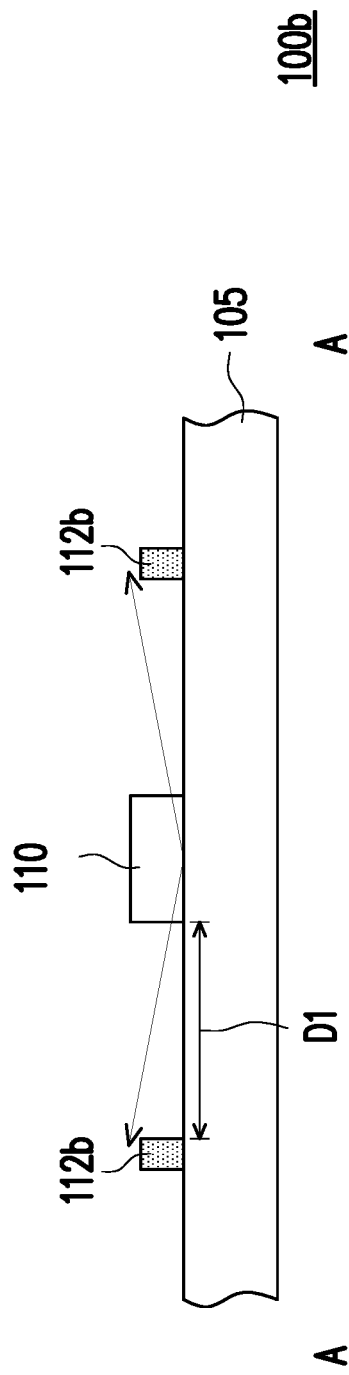
FIG. 6A is a schematic cross-sectional view of the micro LED display panel of FIG. 5 along a line A-A.
Figure 6B:
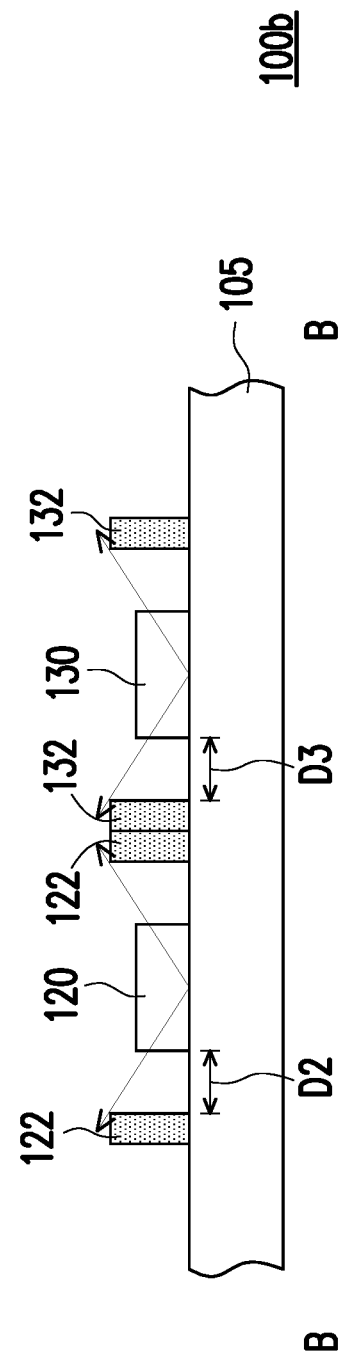
FIG. 6B is a schematic cross-sectional view of the micro LED display panel of FIG. 5 along a line B-B.

FIG. 5 is a schematic top view of a micro LED display panel according to another embodiment of the invention. FIG. 6A is a schematic cross-sectional view of the micro LED display panel of FIG. 5 along a line A-A. FIG. 6B is a schematic cross-sectional view of the micro LED display panel of FIG. 5 along a line B-B. Referring to FIG. 5 to FIG. 6B, a main difference between a micro LED display panel 100b of FIG. 5 and the micro LED display panel 100 of FIG. 1A lies in different arrangements of the first micro LED 110, the second micro LED 120 and the third micro LED 130 in each pixel region 106.

In the embodiment of FIG. 1, the first micro LED 110, the second micro LED 120, and the third micro LED 130 are located in a same row. In the embodiment, the second micro LED 120 and the third micro LED 130 of the micro LED display panel 100b are in different rows from the first micro LED 110. Such arrangement may have a higher resolution.

In addition, in the embodiment, a distance D1 (FIG. 6A) between the first light-shielding wall 112b and the first micro LED 110 is greater than a distance D2 (FIG. 6B) between the second light-shielding wall 122 and the second micro LED 120, and the distance D1 between the first light-shielding wall 112b and the first micro LED 110 is greater than a distance D3 between the third light-shielding wall 132 and the third micro LED 130 (FIG. 6B).

In the embodiment, in the micro LED display panel 100b, in addition to make the first light-shielding wall 112b to have the lowest height to enlarge the irradiation angle of the red light, the irradiation angle of the red light may also be enlarged by increasing the distance D1 between the first light-shielding wall 112b and the first micro LED 110. Similarly, in the micro LED display panel 100b, in addition to make the second light-shielding wall 122 and the third light-shielding wall 132 to have a larger height to reduce the irradiation angle of the green light and the blue light, the irradiation angle of the green light and the blue light may also be reduced by decreasing the distance D2 between the second light-shielding wall 122 and the second micro LED 120 and decreasing the distance D3 between the third light-shielding wall 132 and the third micro LED 130, so that the light patterns of different color light may be close to each other.

Figure 7:
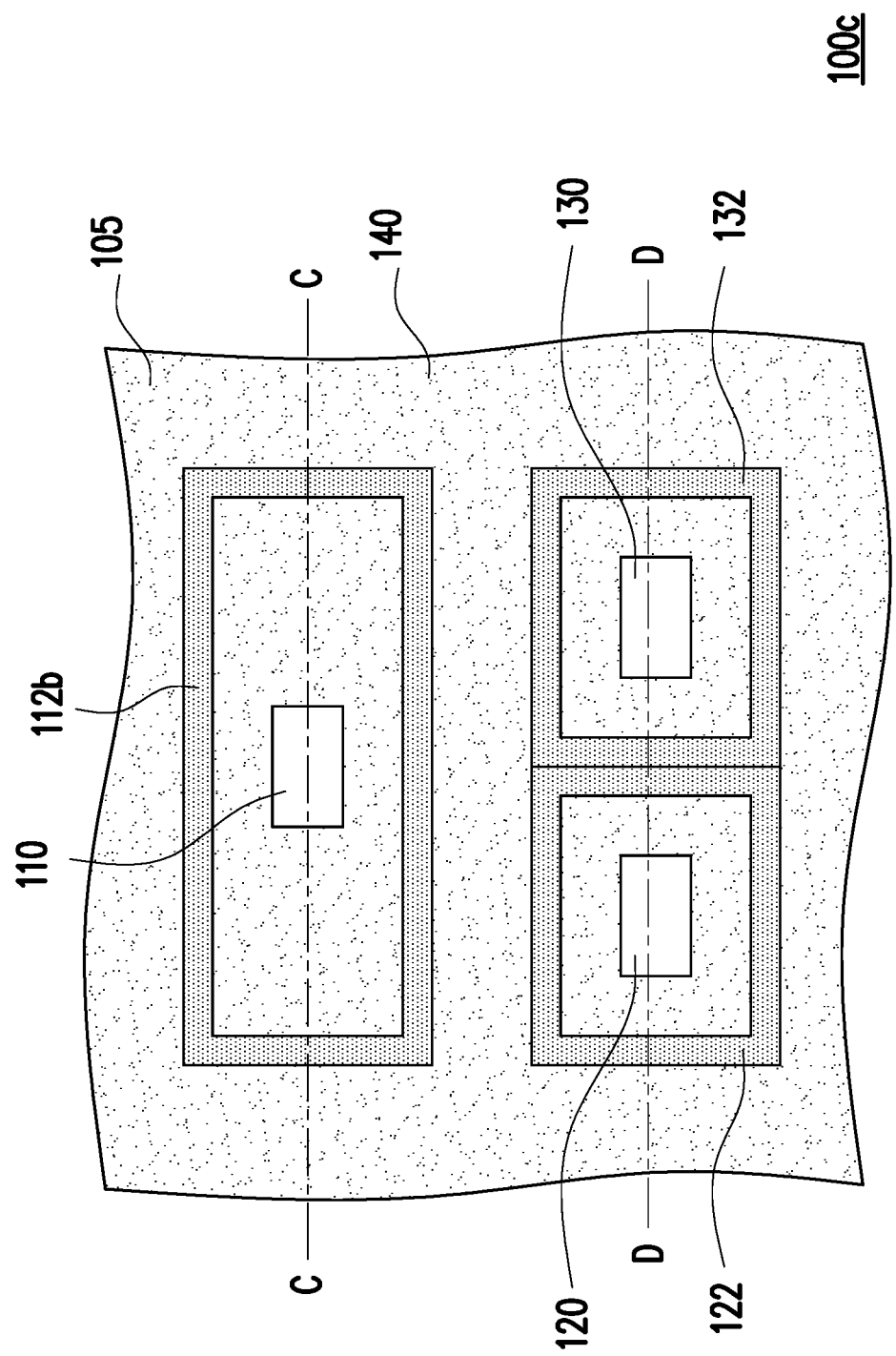
FIG. 7 is a schematic top view of a micro LED display panel according to another embodiment of the invention.
Figure 8A:
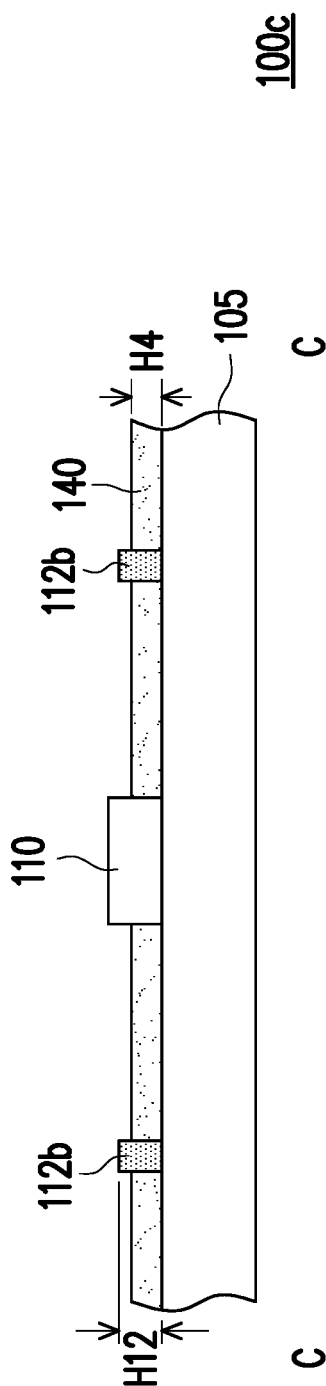
FIG. 8A is a schematic cross-sectional view of the micro LED display panel of FIG. 7 along a line C-C.
Figure 8B:
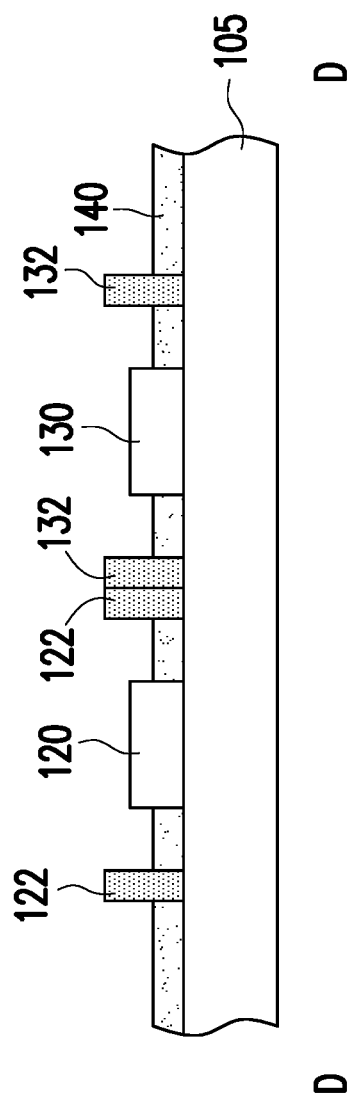
FIG. 8B is a schematic cross-sectional view of the micro LED display panel of FIG. 7 along a line D-D.

FIG. 7 is a schematic top view of a micro LED display panel according to another embodiment of the invention. FIG. 8A is a schematic cross-sectional view of the micro LED display panel of FIG. 7 along a line C-C. FIG. 8B is a schematic cross-sectional view of the micro LED display panel of FIG. 7 along a line D-D.

Referring to FIG. 7 to FIG. 8B, a main difference between a micro LED display panel 100c of FIG. 7 and the micro LED display panel 100b of FIG. 5 is that, in this embodiment, the micro LED display panel 100c further includes a light-absorbing material 140 disposed on the substrate 105 and filled between the first light-shielding wall 112b and the first micro LED 110, between the second light-shielding wall 122 and the second micro LED 120, and between the third light-shielding wall 132 and the third micro LED 130. A height H4 (FIG. 8A) of the light-absorbing material 140 is smaller than the height H12 of the first light-shielding wall 112b. The height of the light-absorbing material 140 is also smaller than the height H11 of the first micro LED 110. Such design may increase the contrast of the display panel and improve display quality.

In the embodiment, the light-absorbing material 140 is used to absorb ambient light. A material of the light-absorbing material 140 may be different from a material of the first light-shielding wall 112b, the second light-shielding wall 122, and the third light-shielding wall 132. Certainly, in other embodiments, the material of the light-absorbing material 140 and the material of the first light-shielding wall 112b, the second light-shielding wall 122, and the third light-shielding wall 132 may also be the same, and may be manufactured together in a same manufacturing process.

Figure 9:
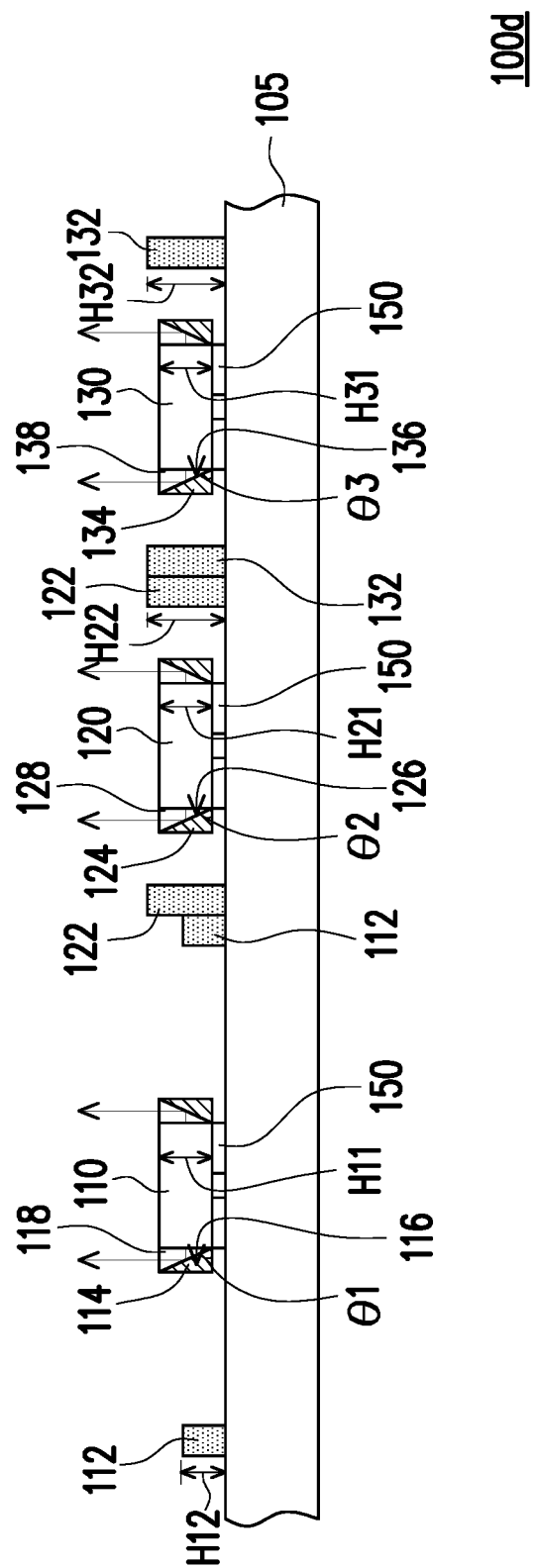
FIG. 9 is a schematic cross-sectional view of a micro LED display panel according to another embodiment of the invention.

FIG. 9 is a schematic cross-sectional view of a micro LED display panel according to another embodiment of the invention. Referring to FIG. 9, a main difference between a micro LED display panel 100d of FIG. 9 and the micro LED display panel 100 of FIG. 1 is that, in the embodiment, the micro LED display panel 100d further includes a first reflector 114, a first transparent insulating layer 118, a second reflector 124, a second transparent insulating layer 128, a third reflector 134, and a third transparent insulating layer 138. The first reflector 114 is located within the first light-shielding wall 112 and arranged around the first micro LED 110. The first reflector 114 has a first inclined surface 116 inclined toward the first micro LED 110. The first transparent insulating layer 118 is filled between the first micro LED 110 and the first inclined surface 116. A part of light emitted by the first micro LED 110 is directly emitted out upward, and a part of the light passes through the first transparent insulating layer 118 and is reflected by the first inclined surface 116 of the first reflector 114 to emit out upward. In the embodiment, the first transparent insulating layer 118 directly contacts a side wall of the first micro LED 110, and the first reflector 114 directly contacts the first transparent insulating layer 118.

The second reflector 124 is located within the second light-shielding wall 122 and arranged around the second micro LED 120. The second reflector 124 has a second inclined surface 126 inclined toward the second micro LED 120. The second transparent insulating layer 128 is filled between the second micro LED 120 and the second inclined surface 126. A part of light emitted by the second micro LED 120 is directly emitted out upward, and a part of the light passes through the second transparent insulating layer 128 and is reflected by the second inclined surface 126 of the second reflector 124 to emit out upward. The second transparent insulating layer 128 directly contacts a side wall of the second micro LED 120, and the second reflector 124 directly contacts the second transparent insulating layer 128.

The third reflector 134 is located within the third light-shielding wall 132 and arranged around the third micro LED 130. The third reflector 134 has a third inclined surface 136 inclined toward the third micro LED 130. The third transparent insulating layer 138 is filled between the third micro LED 130 and the third inclined surface 136. A part of light emitted by the third micro LED 130 is directly emitted out upward, and a part of the light passes through the third transparent insulating layer 138 and is reflected by the third inclined surface 136 of the third reflector 134 to emit out upward. The third transparent insulating layer 138 directly contacts a side wall of the third micro LED 130, and the third reflector 134 directly contacts the third transparent insulating layer 138. The above design may effectively increase a light output rate.

In addition, in the embodiment, the first micro LED 110, the second micro LED 120 and the third micro LED 130 are electrically connected to the substrate 105 through a plurality of electrodes 150. A thickness of each of the first micro LED 110, the second micro LED 120 and the third micro LED 130 together with the electrode 150 does not exceed 10 μm, and a diagonal length does not exceed 50 μm.

Figure 10:
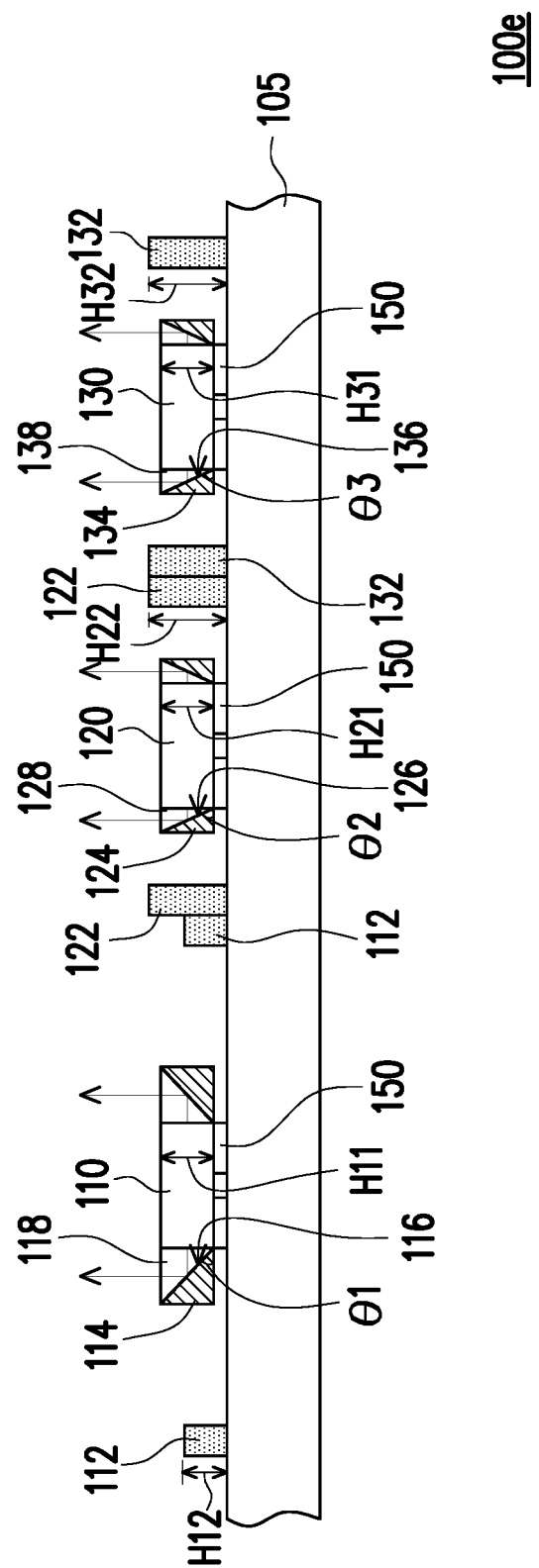
FIG. 10 is a schematic cross-sectional view of a micro LED display panel according to another embodiment of the invention.

FIG. 10 is a schematic cross-sectional view of a micro LED display panel according to another embodiment of the invention. Referring to FIG. 10, a main difference between a micro LED display panel 100e of FIG. 10 and the micro LED display panel 100d of FIG. 9 is that, in FIG. 9, an inclination angle θ1 of the first inclined surface 116 is the same as an inclination angle θ2 of the second inclined surface 126, and the inclination angle θ1 of the first inclined surface 116 is the same as an inclination angle θ3 of the third inclined surface 136.

In the embodiment, the inclination angle θ1 of the first inclined surface 116 may be different from the inclination angle θ2 of the second inclined surface 126, and the inclination angle θ1 of the first inclined surface 116 may be different from the inclination angle θ3 of the third inclined surface 136. For example, the inclination angle θ1 of the first inclined surface 116 may be smaller than the inclination angle θ2 of the second inclined surface 126 and the inclination angle θ3 of the third inclined surface 136, so that the first inclined surface 116 is relatively gentle. In this way, the light emitted by the first micro LED 110 may have a larger irradiation angle range when being reflected by the first inclined surface 116 with a smaller slope.

Namely, in the embodiment, besides that the irradiation angle ranges of red light, green light and blue light may be controlled by the height H12 of the first light-shielding wall 112, the height H22 of the second light-shielding wall 122, and the height H32 of the third light-shielding wall 132, the irradiation angle ranges of red light, green light and blue light may also be controlled by the inclination angle θ1 of the first inclined surface 116, the inclination angle θ2 of the second inclined surface 126 and the inclination angle θ3 of the third inclined surface 136.

Moreover, in FIG. 9 and FIG. 10, a refractive index of the first transparent insulating layer 118 is smaller than a refractive index of an epitaxial layer (not shown) of the first micro LED 110, a refractive index of the second transparent insulating layer 128 is smaller than a refractive index of an epitaxial layer (not shown) of the second micro LED 120, and a refractive index of the third transparent insulating layer 138 is smaller than a refractive index of an epitaxial layer (not shown) of the third micro LED 130. In addition, the refractive index of the first transparent insulating layer 118, the refractive index of the second transparent insulating layer 128, and the refractive index of the third transparent insulating layer 138 are greater than a refractive index of air (n=1).

Since the refractive index of the epitaxial layer is greater than the refractive index of air, and total reflection is likely to occur when a difference of the refractive indexes is large, in order to reduce the probability that the light emitted by the first micro LED 110, the second micro LED 120 and the third micro LED 130 is totally reflected in a lateral direction, in the embodiment, the refractive index of the transparent insulating layer is selected to be between the refractive index of air and the refractive index of the epitaxial layer of the LED to reduce a refractive index difference between the LED and the transparent insulating layer, so as to reduce the probability of producing total reflection between the LED and the transparent insulating layer, and further improve the light-emitting efficiency.

In summary, the first light-shielding wall of the micro LED display panel of the invention is disposed on the substrate and arranged outside the first micro LED, and the second light-shielding wall is disposed on the substrate and arranged outside the second micro LED. The light wavelength of the first micro LED is different from the light wavelength of the second micro LED, and the height of the first light-shielding wall is smaller than the height of the second light-shielding wall. Through the above design, the micro LED display panel of the invention may adjust an irradiation angle of the light emitted by the first micro LED and the second micro LED through the heights of the first light-shielding wall and the second light-shielding wall, so that the light pattern and the irradiation angle of light with a large wavelength are close to the light pattern and the irradiation angle of light with a small wavelength, and the light patterns of light of different colors are closer to reduce the probability of the color shift phenomenon in a large-angle region.

What is claimed is:
1. A micro light-emitting diode display panel, comprising:
a substrate, comprising a plurality of pixel regions arranged in an array;
a first micro light-emitting diode, disposed on one of the pixel regions of the substrate;
a first light-shielding wall, disposed on the substrate and located completely around the first micro light-emitting diode;
a second micro light-emitting diode, disposed on the one of the pixel regions of the substrate and located beside the first micro light-emitting diode;
a second light-shielding wall, disposed on the substrate and located completely around the second micro light-emitting diode, wherein a light wavelength of the first micro light-emitting diode is different from a light wavelength of the second micro light-emitting diode, and a height of the first light-shielding wall is smaller than a height of the second light-shielding wall;
a first reflector, located within the first light-shielding wall and arranged around the first micro light-emitting diode, and having a first inclined surface inclined toward the first micro light-emitting diode;

a first transparent insulating layer, filled between the first micro light-emitting diode and the first inclined surface;

a second reflector, located within the second light-shielding wall and arranged around the second micro light-emitting diode, and having a second inclined surface inclined toward the second micro light-emitting diode; and a second transparent insulating layer, filled between the second micro light-emitting diode and the second inclined surface, wherein a refractive index of the first transparent insulating layer is smaller than a refractive index of the first micro light-emitting diode, and a refractive index of the second transparent insulating layer is smaller than a refractive index of the second micro light-emitting diode, wherein the first transparent insulating layer directly contacts a side wall of the first micro light-emitting diode, the first reflector directly contacts the first transparent insulating layer, the second transparent insulating layer directly contacts a side wall of the second micro light-emitting diode, and the second reflector directly contacts the second transparent insulating layer, the first reflector is different and separated from the first light-shielding wall, the second reflector is different and separated from the second light-shielding wall.

2. The micro light-emitting diode display panel as claimed in claim 1, wherein the height of the first light-shielding wall is smaller than a height of the first micro light-emitting diode, and the height of the second light-shielding wall is greater than a height of the second micro light-emitting diode.

3. The micro light-emitting diode display panel as claimed in claim 1, wherein a distance between the first light-shielding wall and the first micro light-emitting diode is greater than a distance between the second light-shielding wall and the second micro light-emitting diode.

4. The micro light-emitting diode display panel as claimed in claim 1, wherein a portion of the first light-shielding wall located between the first micro light-emitting diode and the second micro light-emitting diode is connected to a portion of the second light-shielding wall located between the first micro light-emitting diode and the second micro light-emitting diode.

5. The micro light-emitting diode display panel as claimed in claim 1, further comprising:

a light-absorbing material, disposed on the substrate and filled between the first light-shielding wall and the first micro light-emitting diode, and between the second light-shielding wall and the second micro light-emitting diode, wherein a height of the light-absorbing material is smaller than a height of the first micro light-emitting diode.

6. The micro light-emitting diode display panel as claimed in claim 5, wherein a material of the light-absorbing material is the same as a material of the first light-shielding wall and the second light-shielding wall.

7. The micro light-emitting diode display panel as claimed in claim 5, wherein a material of the light-absorbing material is different from a material of the first light-shielding wall and the second light-shielding wall.

8. The micro light-emitting diode display panel as claimed in claim 1, wherein an inclination angle of the first inclined surface is different from an inclination angle of the second inclined surface.

9. The micro light-emitting diode display panel as claimed in claim 1, further comprising:

a third micro light-emitting diode, disposed on the one of the pixel regions of the substrate and located beside the first micro light-emitting diode or the second micro light-emitting diode; and a third light-shielding wall, disposed on the substrate and located beside the third micro light-emitting diode, wherein the light wavelength of the first micro light-emitting diode is greater than a light wavelength of the third micro light-emitting diode, and the height of the first light-shielding wall is smaller than a height of the third light-shielding wall.

10. The micro light-emitting diode display panel as claimed in claim 9, wherein a distance between the first light-shielding wall and the first micro light-emitting diode is greater than a distance between the third light-shielding wall and the third micro light-emitting diode.

11. The micro light-emitting diode display panel as claimed in claim 9, wherein the first light-shielding wall and the second light-shielding wall, the second light-shielding wall and the third light-shielding wall or/and the first light-shielding wall and the third light-shielding wall between any adjacent two of the first micro light-emitting diode, the second micro light-emitting diode, and the third micro light-emitting diode are connected.

12. The micro light-emitting diode display panel as claimed in claim 9, further comprising:

a light-absorbing material, disposed on the substrate and filled between the first light-shielding wall and the first micro light-emitting diode, between the second light-shielding wall and the second micro light-emitting diode, and between the third light-shielding wall and the third micro light-emitting diode, wherein a height of the light-absorbing material is smaller than the height of the first light-shielding wall.

13. The micro light-emitting diode display panel as claimed in claim 9, further comprising:

a first reflector, located within the first light-shielding wall and arranged around the first micro light-emitting diode, and having a first inclined surface inclined toward the first micro light-emitting diode;

a first transparent insulating layer, filled between the first micro light-emitting diode and the first inclined surface;

a second reflector, located within the second light-shielding wall and arranged around the second micro light-emitting diode, and having a second inclined surface inclined toward the second micro light-emitting diode;

a second transparent insulating layer, filled between the second micro light-emitting diode and the second inclined surface;

a third reflector, located within the third light-shielding wall and arranged around the third micro light-emitting diode, and having a third inclined surface inclined toward the third micro light-emitting diode; and a third transparent insulating layer, filled between the third micro light-emitting diode and the third inclined surface, wherein a refractive index of the first transparent insulating layer is smaller than a refractive index of the first micro light-emitting diode, a refractive index of the second transparent insulating layer is smaller than a refractive index of the second micro light-emitting diode, and a refractive index of the third transparent insulating layer is smaller than a refractive index of the third micro light-emitting diode.

14. The micro light-emitting diode display panel as claimed in claim 13, wherein an inclination angle of the first inclined surface is different from an inclination angle of the second inclined surface, and the inclination angle of the first inclined surface is different from an inclination angle of the third inclined surface.

\* \* \* \* \*